United States Patent
Sonntag et al.

(10) Patent No.: US 12,019,124 B2
(45) Date of Patent: Jun. 25, 2024

(54) CHARGE MEASUREMENT CALIBRATION IN A SYSTEM USING A PULSE FREQUENCY MODULATED DC-DC CONVERTER

(71) Applicant: Silicon Laboratories Inc., Austin, TX (US)

(72) Inventors: Jeffrey L. Sonntag, Austin, TX (US); Timothy J. Dupuis, Austin, TX (US); Jinwen Xiao, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 656 days.

(21) Appl. No.: 17/215,723

(22) Filed: Mar. 29, 2021

(65) Prior Publication Data

US 2021/0215765 A1   Jul. 15, 2021

Related U.S. Application Data

(62) Division of application No. 15/392,475, filed on Dec. 28, 2016, now Pat. No. 10,996,281.

(51) Int. Cl.
   - G01R 31/387 (2019.01)
   - G01R 31/3832 (2019.01)
   - G01R 31/385 (2019.01)

(52) U.S. Cl.
   CPC ....... G01R 31/387 (2019.01); G01R 31/3833 (2019.01); G01R 31/385 (2019.01)

(58) Field of Classification Search
   CPC . G01R 31/387; G01R 31/3833; G01R 31/385
   See application file for complete search history.

(56) References Cited

U.S. PATENT DOCUMENTS

| | | |
|---|---|---|
| 5,144,218 A | 1/1992 | Bosscha |
| 5,907,238 A | 5/1999 | Owerko et al. |
| (Continued) | | |

FOREIGN PATENT DOCUMENTS

| | | |
|---|---|---|
| CN | 1051793 A | 5/1991 |
| CN | 101174710 A | 5/2008 |
| (Continued) | | |

OTHER PUBLICATIONS

Sendyne Corp., "Sendyne SFP101," Sendyne® Sensing Products Family, Rev 1.2, 2015, pp. 1-55.

(Continued)

*Primary Examiner* — Nha T Nguyen
(74) *Attorney, Agent, or Firm* — Zagorin Cave LLP

(57) ABSTRACT

A calibration current load is selectively coupled to an output of a pulse frequency modulated (PFM) DC-DC converter during a calibration operation to increase charge supplied from a battery supplying an input voltage to the converter. A voltage across a sense resistor in series with the battery is integrated during a measurement interval while the calibration current load is coupled to the output. A charge drawn per pulse from the battery is determined based on the sense resistor, the integrated voltage and the number of pulses during the measurement interval. Alternatively, a first PFM frequency is determined with a first calibration current load coupled to the converter output. A second PFM frequency is determined with a second calibration current load. The charge drawn per pulse from the battery is determined based on the first and second PFM frequencies and the first and second calibration current loads.

20 Claims, 6 Drawing Sheets

(56) References Cited

U.S. PATENT DOCUMENTS

| | | | |
|---|---|---|---|
| 6,009,421 A | 12/1999 | Xie | |
| 6,507,832 B1 | 1/2003 | Evans et al. | |
| 6,617,972 B2 | 9/2003 | Takarada | |
| 7,064,531 B1 | 6/2006 | Zinn | |
| 7,148,670 B2 | 12/2006 | Inn et al. | |
| 8,710,810 B1 | 4/2014 | McJimsey et al. | |
| 8,779,729 B2 | 7/2014 | Shiraishi | |
| 8,823,419 B1 | 9/2014 | O'Leary et al. | |
| 9,134,744 B2 | 9/2015 | Nork | |
| 9,557,354 B2 | 1/2017 | Chen et al. | |
| 9,929,650 B1* | 3/2018 | Kirchner | H02M 3/158 |
| 10,270,272 B2 | 4/2019 | Sonntag et al. | |
| 11,841,391 B1* | 12/2023 | Haisch | G02F 1/0353 |
| 2005/0001603 A1* | 1/2005 | May | H02M 3/1588 323/284 |
| 2008/0100265 A1 | 5/2008 | Lim et al. | |
| 2008/0278223 A1 | 11/2008 | Kernahan | |
| 2009/0046487 A1* | 2/2009 | Emira | H02M 3/158 363/78 |
| 2010/0282276 A1 | 11/2010 | Kueper et al. | |
| 2012/0098518 A1 | 4/2012 | Unagami | |
| 2012/0203484 A1 | 8/2012 | Ando et al. | |
| 2012/0229110 A1 | 9/2012 | Huang et al. | |
| 2013/0049716 A1* | 2/2013 | Saeki | H02M 3/156 323/271 |
| 2013/0063100 A1* | 3/2013 | Henzler | H02M 3/156 323/234 |
| 2014/0191741 A1 | 7/2014 | Nork | |
| 2014/0354257 A1* | 12/2014 | Paul | H02M 1/44 323/284 |
| 2015/0145520 A1 | 5/2015 | Kain | |
| 2015/0171744 A1* | 6/2015 | Fabbro | H02M 3/1582 323/234 |
| 2015/0311795 A1 | 10/2015 | Yang et al. | |
| 2016/0181921 A1* | 6/2016 | Zhang | H02M 3/158 323/271 |
| 2016/0359413 A1* | 12/2016 | Ihs | H02M 1/08 |
| 2017/0093271 A1 | 3/2017 | Lai et al. | |

FOREIGN PATENT DOCUMENTS

| | | |
|---|---|---|
| CN | 103916014 A | 7/2014 |
| CN | 105277889 A | 1/2016 |

OTHER PUBLICATIONS

Awadallah, M., and Bala, V., "Accuracy improvement of SOC estimation in lithium-ion batteries", Journal of Energy Storage, Mar. 11, 2016, pp. 95-104.

* cited by examiner

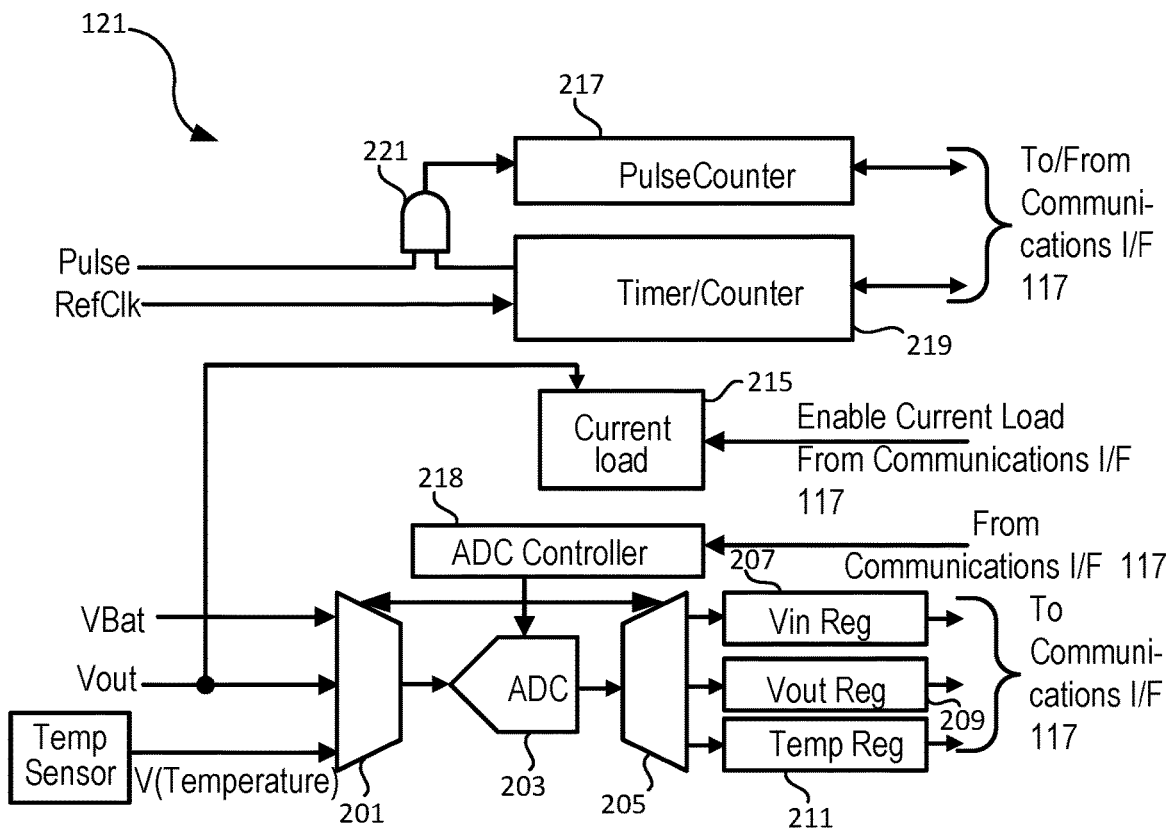
Fig. 2A
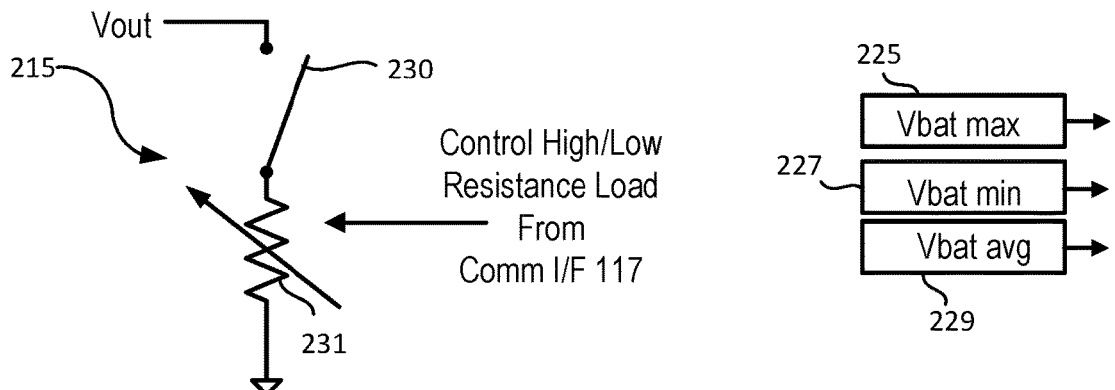
Fig. 2B
Fig. 2C

CHARGE MEASUREMENT CALIBRATION IN A SYSTEM USING A PULSE FREQUENCY MODULATED DC-DC CONVERTER

RELATED APPLICATIONS

This application is a divisional application of the application entitled "Charge Measurement Calibration In A System Using A Pulse Frequency Modulated DC-DC Converter", application Ser. No. 15/392,475, filed Dec. 28, 2016, naming Jeffrey L. Sonntag, Timothy J. Dupuis, and Jinwen Xiao as inventors, which application is incorporated herein by reference. This application relates to the application entitled "Charge Measurement In A System Using A Pulse Frequency Modulated DC-DC Converter", naming Jeffrey L. Sonntag, Timothy J. Dupuis, and Jinwen Xiao as inventors, application Ser. No. 15/392,487, filed Dec. 28, 2016, now U.S. Pat. No. 10,270,272, which application is incorporated by reference herein in its entirety.

BACKGROUND

Field of the Invention

This invention relates to charge measurement for use in determining state of charge in a battery.

Description of the Related Art

Traditional coulomb counting has been used to predict the remaining charge in a battery and has been widely used in conjunction with Lithium-Ion batteries for such prediction. Traditional coulomb counting is based on the integration of the measured voltage drop (IR drop) across a small resistor in series with the power supply. However, further improvements in determining charge transferred from a battery to address a variety of battery technologies and environments are desirable.

SUMMARY OF EMBODIMENTS OF THE INVENTION

In one embodiment, a method includes setting a calibration current load of a pulse frequency modulated (PFM) DC-DC converter to a first current load and determining a first PFM frequency of the PFM DC-DC converter with the first current load. The calibration current load of the PFM DC-DC converter is set to a second current load higher than the first current load and a second PFM frequency of the PFM DC-DC converter is determined with the second current load. A charge drawn per pulse from a battery is determined using the first PFM frequency and the second PFM frequency.

In another embodiment, a method for determining a charge drawn per pulse from a battery in a pulse frequency modulated (PFM) DC-DC converter includes enabling a calibration current load to increase the calibration current load above an operational current load. The number of pulses corresponding to a number of switching events of the PFM DC-DC converter that occur in a measurement interval is counted. The method further includes integrating a voltage across a resistor sensed during the measurement interval and supplying an integrated voltage indicative thereof from an integrator, the resistor in series with the battery. The charge drawn per pulse is determined using the number of pulses, the integrated voltage, and a resistance value of the resistor.

In another embodiment, an apparatus includes a calibration current load selectively coupled to an output of a pulse frequency modulated (PFM) DC-DC converter during at least a portion of a calibration operation to increase charge supplied from a battery. An interval counter determines a measurement interval and a pulse counter counts pulses corresponding to switching events that occur in the PFM DC-DC converter during the measurement interval.

In another embodiment, an apparatus includes a calibration current load is selectively coupled to an output of a pulse frequency modulated (PFM) voltage converter, wherein the calibration current load is coupled to the output during a calibration operation to cause an increased current load as compared to an operational current load. An interval counter determines a measurement interval during which measurement interval the calibration current load is coupled to the output. A sense resistor is in series with a battery supplying an input voltage to the PFM voltage converter. A pulse counter counts pulses corresponding to switching events that occur in the PFM voltage converter during the measurement interval and provides a pulse count indicative thereof. An integrator integrates a voltage across the resistor sensed during the measurement interval during which the calibration load is enabled.

BRIEF DESCRIPTION OF THE DRAWINGS

The present invention may be better understood, and its numerous objects, features, and advantages made apparent to those skilled in the art by referencing the accompanying drawings.

FIG. 2A illustrates an embodiment of the calibration logic used to determine charge drawn per PFM pulse.

FIG. 2B illustrates an embodiment of a current load added during calibration.

FIG. 2C illustrates an embodiment in which maximum, minimum, and average information is maintained for the battery voltage.

The use of the same reference symbols in different drawings indicates similar or identical items.

DETAILED DESCRIPTION

Figure 1:
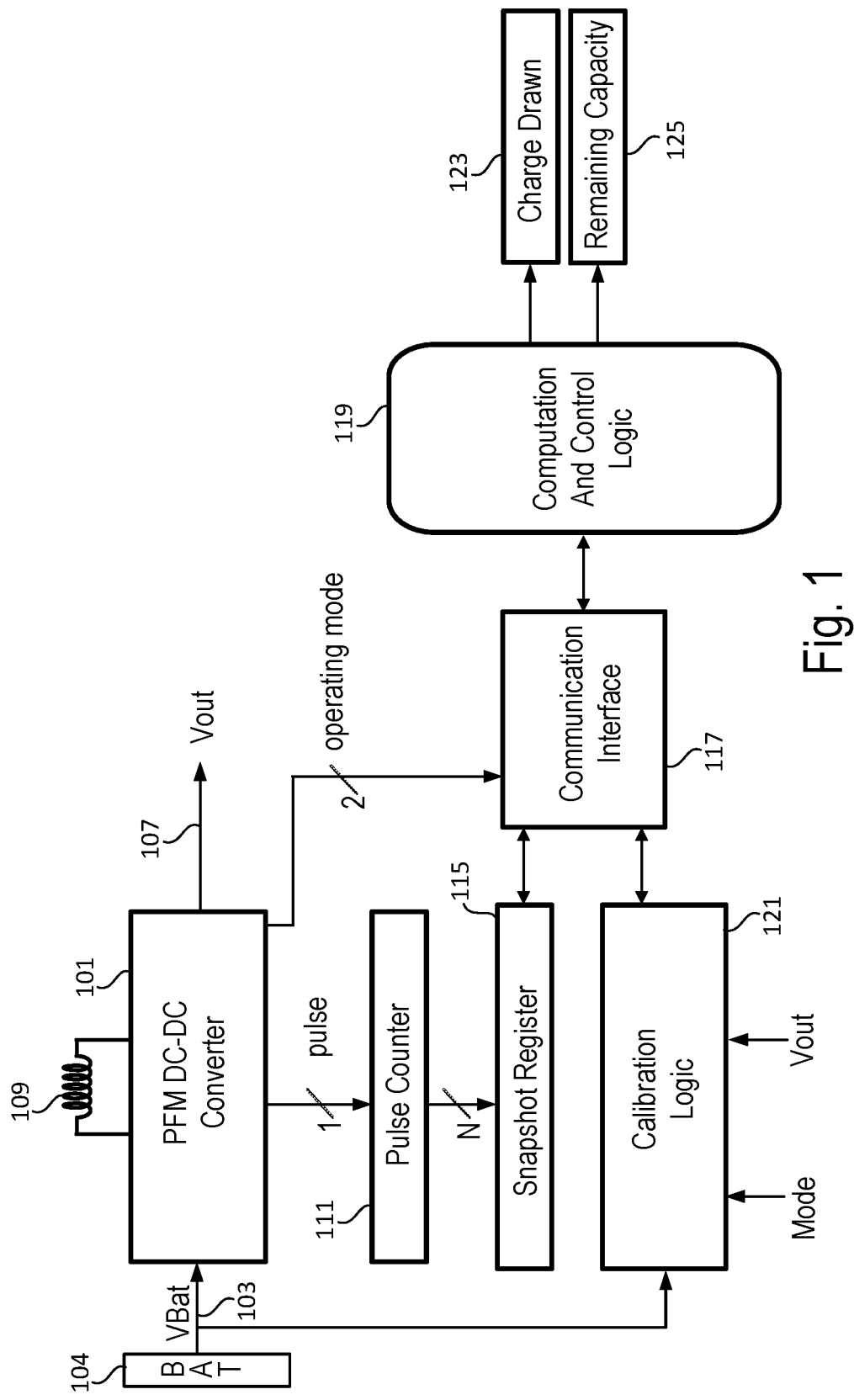
FIG. 1 illustrates a top level view of a charge measuring system according to an embodiment.

FIG. 1 illustrates a top level view of a system according to an embodiment of the present invention. The pulse frequency modulation (PFM) DC-DC converter 101 converts an input voltage Vbat 103 from a battery 104 to an output voltage Vout 107, utilizing a series of pulse switching events in the inductor. Each pulse event transfers an amount of charge from the battery that depends generally on the value of inductor 109, the battery voltage Vbat, the output voltage Vout, the operating mode, and the peak current (Ipk) allowed in the switching operation. During a calibration operation, the charge transferred during each switching event or pulse is determined. The charge transferred during calibration may then used together with current operating conditions such as battery voltage, output voltage, and operating mode to determine a charge transferred per pulse operationally. By counting switching events, and monitoring temperature, the total charge transferred from the battery may be determined and the state of charge (or remaining battery lifetime) may be estimated based on the total charge drawn and the battery capacity. As used herein, battery capacity refers to the total amount of charge that can be drawn from a new battery. Battery state of charge refers to the remaining amount of charge that can be drawn from the battery.

Several different approaches for determining the charge transferred during each calibration switching event (also referred to herein as a pulse) are described. One approach for determining charge drawn from the battery per pulse during calibration measures change in the pulse rate with a change in current loading. In another embodiment, the calibration operation measures battery current during a calibration period while measuring the total pulse rate and while adding sufficient load current to ensure that the total IR drop is much larger than the possible residual offset of the measurement system.

Once the charge transferred per switching event is determined for a calibration operation, during operation an operational charge transferred per switching event may be determined based on the calibration data and current operating parameters of the DC-DC converter as described further herein. The number of switching events operationally may be counted and the total charge drawn from the battery may be determined as (the number of switching events)×(the charge transferred per switching event). Based on the total charge drawn and in some embodiments the temperature (particularly for temperature dependent battery types), the battery state of charge may be estimated.

Referring still to FIG. 1, calibration logic 121 (an embodiment of which is shown in more detail in FIG. 2A) receives DC-DC converter information such as operational mode (e.g., buck, boost, buck-boost), input voltage during calibration, and the output voltage during calibration. The calibration logic determines calibration information related to charge drawn per pulse, which is supplied to computation and control logic 119. The calibration logic 121, described in more detail herein, may be controlled by the computation and control logic 119, which may be used to compute how much charge is transferred in each pulse ($Q_{batCal}$) during calibration.

The calibration information (charge drawn per pulse during calibration or information from which charge drawn per pulse during calibration may be calculated), as described further herein, along with certain current operating parameters (e.g., Vbat, mode, and Vout), are then used to determine charge drawn per pulse operationally ($Q_{batOp}$). Because $Q_{batOp}$ is a function of the battery voltage during operation, $Q_{batOp}$ changes as the battery discharges and computation and control logic 119 should receive updated battery voltage data during operation in order to keep the $Q_{batOp}$ estimate accurate.

Referring still to FIG. 1, the pulse counter 111 counts switching events operationally, and in an embodiment, counts modulo $2^N$, where N is sufficiently large so that the counter rolls over no more than once between sequential accesses of the snapshot register 115 by the computation process. In an embodiment, the counter may be a four byte counter or any other appropriate size for the application. The snapshot register 115 transcribes a copy of the value of the pulse counter for access by the communication interface 117 and ensures that the pulse count value supplied to the communication interface is not transitioning at the time it is supplied. The communication interface 117 can be a serial interface for chip to chip communication such as an I²C bus or the Serial Peripheral Interface (SPI) bus, or even a wireless communication interface. In other embodiments, the communication interface may be custom and may be utilized for intra-chip communication. The number of pulses counted along with the determination of charge drawn per pulse operationally ($Q_{batOp}$) may be used to determine the charge drawn for the pulses counted, which may in turn be used to determine the battery state of charge.

In an embodiment, the computation and control logic 119 supplies output register 123 with the total charge drawn from the battery for the pulse count read and output register 125 with the remaining capacity (battery state of charge), as described further herein. Computation and control logic maintains a total charge drawn from the battery in order to compute the battery state of charge. Remaining capacity may be expressed as remaining battery charge, or some fraction of the original nominal battery charge. However, the usable remaining battery charge may be significantly different than the total remaining battery charges for many battery chemistries. For alkaline batteries at 0 degrees C., for example, the usable charge might be zero, though the remaining charge is 50% of the original capacity. When restored to room temperature, most of the remaining charge becomes usable. So, in modelling how the battery will behave in the future at the current temperature, knowing the current temperature can be important in determining useable remaining charge. Thus, computation and control logic 119 may take temperature into consideration in determining usable remaining charge and provide usable remaining battery charge, total remaining battery charge, or both, as battery state of charge. Note that the computation and control logic 119 may be implemented as software running on programmable logic such as a microcontroller (MCU), or may be implemented as hardware, or as a combination of hardware and programmed logic.

Before various embodiments are described, some shortcomings in traditional approaches to coulomb counting are explored. One problem with traditional coulomb counting is that any offset remaining in the measurement process is an error, which is integrated across the discharge time of the battery. If the discharge time is long (years), even a very small error in offset can become a large error in the measured charge. Thus, for systems where the battery lifetime is meant to be multiple years, traditional coulomb counting has shortcomings. In addition, the IR drop should be very small so that only a small percentage of system power is consumed by the IR drop measurement.

Another problem with the traditional approach is that the measurements must be high resolution (the voltage drop on the reference resistor must be small for efficiency) and must be done at a reasonably high bandwidth and sampling rate. Modern systems may sleep for a high duty cycle and then draw substantial power at a very low duty cycle. Even with a reasonably high bandwidth and sampling rate, measurements made for systems that draw substantial power at very low duty cycles may easily miss the pulse of drawn power entirely. Further, the high resolution measurement and the bandwidth and sampling rate requirements are incompatible with extremely low power consumption. Therefore, the IR measurement system draws more power than would be desired. Again, this is worse for systems that must operate on a single charge for years and can result in the total charge used by the measurement system becoming large relative to the total battery charge.

So while traditional coulomb counting works reasonably well for systems which discharge in a few days, such as a modern cell phone, it can become hopelessly inaccurate in systems that discharge in months or years.

Another approach for estimating battery state of charge is to measure the open circuit voltage (OCV) and look up the state of charge on a discharge curve. However, discharge curves change as a function of temperature, manufacturer, and loading/pulse conditions. Additionally, estimating OCV from the behavior of a system that is not turned off is hard. Also, for some battery types, the change in output voltage with remaining capacity has very wide flat regions, where remaining capacity cannot be predicted. One battery type popular in metering applications, Lithium Thionyl Chloride, has a discharge curve which remains flat until the last 10% or so of battery capacity remaining. The desire for remaining lifetime estimation for these battery types is not addressed by OCV battery voltage measurement or IR based coulomb counters.

One additional problem is the concept of coulomb counting itself. For some battery types (e.g., Lithium Ion batteries), the battery can be seen as a nearly ideal capacitor, with the same charge available to be drawn, regardless of temperature. In this case, calculating total charge drawn is a good way to estimate state of charge. However, many other battery types (e.g., alkaline), including most non-rechargeable battery types, in contrast, have extreme temperature dependence, with current drawn at low temperatures causing large voltage drops, which prevent operation of the powered circuits, despite substantial charge remaining in the battery. Predicting the remaining usable capacity at the current (or other) temperature demands not just simple subtraction of the total used charge from the initial rated charge, but modelling of how the battery internal resistance changes with temperature and remaining charge. That modelling may be based on empirical observations of how the internal resistance changes with temperature and usable capacity. Such observations can be built into modelling of the battery.

Thus, improvements in predicting remaining lifetime are desirable, particularly, e.g., for applications where the system battery life is years, for those batteries that have significant temperature dependence, for those batteries for which the change in output voltage with remaining capacity has very wide flat regions, or for systems that draw substantial power at very low duty cycles.

During calibration, the calibration logic is used in determining charge drawn per pulse ($Q_{batCal}$) from the battery. The following discussion explains how $Q_{batCal}$ may be determined during calibration. In general, when the PFM DC-DC converter is operating in buck mode, the charge drawn per PFM cycle can be calculated as:

$$Q_{out} = \frac{LI_{pk}^2}{2(V_{in} - V_{out})} \quad (1)$$

Boost only, or traditional buck/boost would produce different but similar formulations that are well understood by those of skill in the art. Note that we only need to know $LI_{pk}^2$ (which is generally substantially constant and can be calibrated or measured rarely), and Vout, Vin (where Vin is Vbat). Both Vout and Vin are easily measured and change slowly (battery discharge may change Vin) or a program change may change Vout, and the computation and control logic 119 should know, or easily be made aware of a change in Vout.

The charge transferred to the output in each pulse, given a known load current and a measured PFM frequency is:

$$Q_{out} = \frac{I_{load}}{f_{PFM}} \quad (2)$$

Note that $I_{load}$ and the reference frequency used for the frequency measurement may be imperfectly trimmed, or even temperature sensitive. These quantities may be measured in product test, with the measurement results stored in a one time programmable (OTP) memory, available to make the charge measurement more accurate. Because the total load current includes both a calibration load current and a nonzero (and likely unknown) system load current, two frequency measurements are made, with two different load currents. One load current includes the calibration current load and the system current load and the other load current includes just the system current load. The charge transferred to the output in each pulse is:

$$Q_{out} = \frac{I_{load1} - I_{load2}}{f_{PFM1} - f_{PFM2}} \quad (3)$$

Note that this result depends on the difference in load current between the two calibration operations. An unknown system load current does not affect the measurement, so long as the unknown system load current does not change between the two measurements. Assuming that a good estimate of the efficiency, η, can be made, the charge drawn per pulse from the battery can be calculated as:

$$Q_{batCal} = \frac{Q_{out} V_{outCal}}{\eta V_{batCal}}, \quad (4)$$

where $V_{outCal}$ is the output voltage during calibration, $V_{batCal}$ is the battery voltage during calibration, and $Q_{out}$ is the charge transferred to the output as determined in equation (3). OTP storage of information sufficient to model efficiency well as a function of input and output voltages and even temperature may be stored in the OTP. Once $Q_{batCal}$ is known at calibration time, or the values from which $Q_{batCal}$ can be calculated are known from calibration, $Q_{batOp}$ for operation at other voltages can be calculated by making use of equation (1) for the case where calibration and operation are both in buck mode, resulting in:

$$Q_{batOp} = Q_{batCal} \frac{V_{batCal} - V_{outCal}}{V_{batOp} - V_{outOp}} \quad (5)$$

When the operating mode is not buck in both the calibration measurement and during operation, relationships similar to equation (1) for Qbat in these operating modes may be used to allow one skilled in the art to derive the appropriate transformation to allow calculation of $Q_{batOp}$ (as in equation 5) when other operating modes are appropriate during the calibration measurement or during operation. Calibration can be done for $LI_{pk}^2$ once after system powers up for the first time, or could be repeated rarely or when temperature change has become greater than a threshold temperature change since the last calibration. Note inductance and $I_{pk}$ might change a little with temperature. If predictable and known, that change can be included in the calculation, or, if unpredictable, the calibration process can be repeated.

FIG. 2A illustrates an embodiment of the calibration logic 121. The calibration hardware includes a selector circuit 201 that selects inputs to supply to analog to digital converter (ADC) 203. The ADC 203 digitizes the input voltage (Vbat), the output voltage, and the sensed temperature. In other embodiments, only Vbat and sensed temperature may be supplied to ADC 203 or only Vbat and Vout. These quantities change very slowly, so the ADC operation can be at a low duty cycle so as to draw an average current that is negligibly small. For example, the battery voltage may be measured every 1000 PFM cycles. The temperature may be measured at the same rate or at a different frequency depending on system needs. In one embodiment, the ADC controller 218, which controls the ADC operation including selecting which voltage to convert to digital and conversion frequency, operates independently, rather than being managed through the communication interface 117. In other embodiments, the ADC controller 218 may be managed by the computation and control logic 119 through the communications interface 117. The temperature may be supplied as a temperature dependent voltage that could be from a Vbe voltage, where Vbe is a transistor voltage sensitive to temperature, or from a temperature sensor on or near the battery. In low average power systems, temperature of the integrated circuit components in the system should be close to battery temperature.

The digitized input voltage (Vbat), output voltage, and temperature are supplied by demultiplexer 205 to the appropriate one of the registers Vin 207, register Vout 209, and temperature register 211. These registers are supplied through the communications interface 117 to the computation and control logic 119. These values may be utilized both during calibration and after calibration to determine both the charge transferred and to calculate the battery state of charge.

The current load 215 is used in support of the calibration operation. The current load may be implemented as a resistor (or a current source) and may be trimmed in product test to high accuracy. In one embodiment, multiple load settings are used for calibration of $LI_{pk}^2$, e.g., a high resistance load for the first count of pulses and a low resistance load for the second count of pulses, where the second count of pulses is higher because the PFM rate for the DC-DC converter is higher with the low resistance load (higher current load). The current load may be controlled via the communication interface 117. Thus, e.g., as shown in FIG. 2B the communication interface 117 may select the current load by adjusting the variable resistor 231 to a desired resistance value. Initially, the resistance is set to a high value resulting in a first current load. The variable resistance is then changed to a lower resistance load resulting in a second current load that is higher than the first current load. The higher current load causes the PFM pulse rate to be substantially increased to supply added charge required by the increased current load on the output. The increased pulse rate is used in determining the $Q_{batCal}$ value. Calibration requires modified system behavior, so in preferred embodiments, the operation is done rarely, possibly only once after startup, or after a substantial temperature change.

The calibration logic 121 also includes a timer/counter 219 (also referred to herein as an interval counter) and a pulse counter 217 to determine PFM frequency. The combination of the timer/counter 219 and the small additional gated pulse counter 217 with AND gate 221 allows accurate measurement of the pulse rate during a specific measurement interval. In one embodiment, the computation and control logic 119 loads the timer/counter 219 counts with a count value corresponding to a specific measurement interval through the communication interface 117 and initiates the timing operation. In another embodiment, the timer/counter 219 may be implemented as a monostable multivibrator to provide a pulse corresponding to the measurement interval. The timer/counter 219 provides an asserted signal during the measurement interval so pulses are supplied through AND gate 221 to the pulse counter 217. The computation and control logic 119 retrieves the result from pulse counter 217 at the end of the measurement interval for both the high current load and the low current load.

In another embodiment to determine PFM frequency, a fixed number of pulses are counted, interval counter 219 may be enabled over the communications interface 117, which in turn allows pulse counter 217 to count pulses first with the low current load. When the pulse counter has counted a predetermined number of pulses, e.g., 10 pulses, the timer/counter is stopped. The process is repeated after the high current load is switched in and the pulse counter 217 counts 10 pulses while the timer/counter counts the length of time it takes to count 10 pulses.

Figure 3:
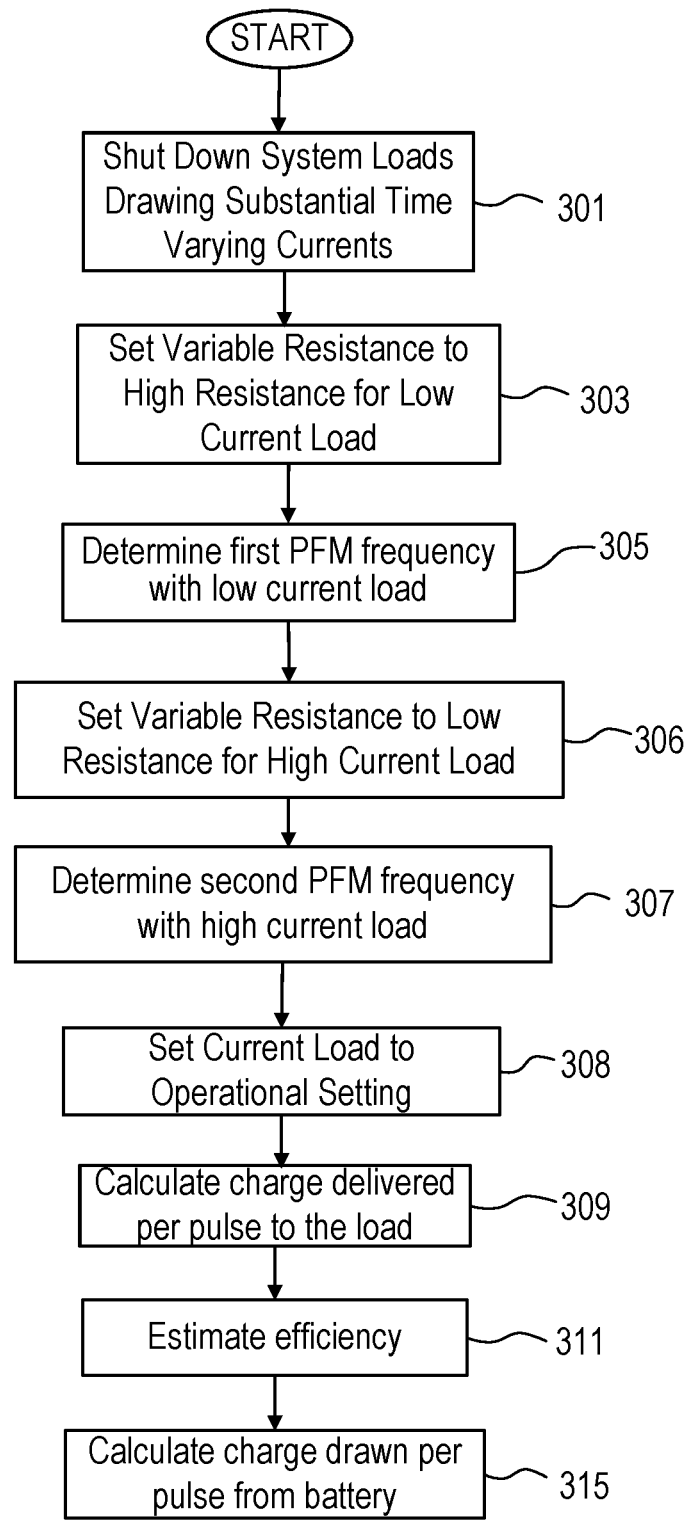
FIG. 3 illustrates a flow chart illustrating operation of the calibration hardware.

FIG. 3 illustrates a flow diagram of an embodiment of the calibration operation. In 301, the calibration operation starts by shutting down system loads that might draw substantial time-varying current. In an embodiment, the computation and control logic 119 provides control for the calibration operation. Shutting down system loads that might draw substantial time-varying current ensures that the PFM frequency is due to the added current load 215 rather than system loads that happen to be drawing substantial time-varying current during the measurement interval. The calibration operation is typically done rarely, once, or driven by a change in temperature above a threshold change.

In step 303, the resistance load is set to a high resistance for a low current load. In 305 the first PFM frequency is determined with the low current load. As mentioned earlier, the value of the low current load may be determined in product test. In step 306, the calibration operation sets the variable resistance to a low resistance resulting in a higher current load. In step 307, the second PFM frequency is determined with the second load current. As mentioned earlier, the value of the high current load may be determined in product test. In step 308 the calibration current load may be set to an operational setting. In step 309, the computation and control logic calculates the charge delivered per pulse to the load ($Q_{out}$), e.g., in accordance with equation (3) above.

In an optional step 311, the computation process may use a lookup table or interpolation to estimate efficiency as function of the battery voltage $V_{bat}$ and/or temperature. Efficiency is the ratio of power out/power in for the PFM DC-DC converter. In other embodiments, a fixed estimated value for efficiency may be used. Finally, in 315, the charge per pulse delivered to the load is referred back to the battery and the charge drawn per pulse from the battery during calibration is calculated in accordance with equation (4) above.

The calibration operation represented in equations (3) and (4) works independently of whether the PFM DC-DC converter is operating in buck, boost, or buck/boost mode. The calibration operation works so long as any change in system load current between the two PFM measurements is small relative to $I_{calLoad}$ or the change in system load is small between measuring an equal number of pulses. Satisfying that generally depends on ensuring that system loads that might draw substantial time-varying current are turned off. That is generally possible (at least on startup) in small systems under the control of the computation and control logic implemented, e.g., on an MCU that provides system control. In systems under some other control, ensuring system loads that might draw substantial time-varying current are off, may not be possible.

As the battery ages, the battery voltage $V_{bat}$ changes and so the charge drawn per pulse from the battery changes during operation. In order to accurately track the battery state of charge, every time the state of charge is measured, the input voltage Vbat during operation needs to be known. Although Vbat changes slowly, the measurement of Vbat has to be performed frequently enough to maintain the desired accuracy of the state of charge calculation. Similarly, if the output voltage generated by the DC-DC changes during operation, the calculation for charge drawn per pulse is affected. Once the charge drawn per pulse determined during calibration is known, $Q_{batCal}$, the charge drawn per pulse during operation ($Q_{batOp}$) can be determined in accordance with equation (5) above, where the calibration mode and operational mode are both buck.

If the original mode and original voltages are known, the charge drawn per pulse ($Q_{batOp}$) in other modes or at other voltages can be calculated when needed. For example, the charge drawn per PFM cycle in boost mode is:

$$Q_{out} = \frac{LI_{pk}^2}{2}\left(\frac{V_{out}}{V_{in}(V_{out} - V_{in})}\right) \qquad (6)$$

Combining equation (6) and equation (1), charge per pulse drawn from the battery in boost mode may be determined from the calibration done in buck mode as follow:

$$Q_{batOp} = Q_{batCal} \frac{V_{outop}}{V_{batOp}} \frac{V_{batCal} - V_{outCal}}{VoutOp - VbatOp} \frac{I_{pkOp}^2}{I_{pkCal}^2} \qquad (7)$$

While equations 6 and 7 illustrate how calibration can be done in buck mode and used to determine charge drawn in boost mode, more generally, calibration can be performed in one mode, e.g., buck, boost, or buck-boost, and used in determining charge drawn in the same or another operating mode, e.g., buck, boost, or buck-boost. That can be particularly advantageous because a system may start out operating in one mode, e.g., buck mode, and then switch to boost mode as the battery ages.

Note that equation (7) does not assume that $I_{pk}$ remains constant between calibration and operation conditions. The possible change in peak inductor current results in the last multiplicative term above in equation (7). In contrast, when calculating $Q_{batOp}$ (equation (5)) when both calibration and operating modes were buck, the assumption was made that the peak inductor current does not change with temperature. The calculations to determine $Q_{batOp}$ may assume the peak inductor current does not change with temperature or battery voltage. The extent to which the peak inductor current does change with temperature and/or battery voltage will constitute a source of error in the gain of the charge measurement system, unless an estimate of such sensitivity is included in the calculation of $Q_{batOp}$.

Because of limited knowledge of the initial state of charge of a battery such as battery quality, age, and manufacturer, coulomb counting approaches described herein may be backstopped in some embodiments by a voltage measurement based state of charge estimation. The best state of charge estimate from Coulomb counting may be used when open circuit measurements indicate the battery is not near end of life. The state of charge estimate from open circuit voltage measurements may be used when open circuit measurements indicate the battery is nearing end of life.

The computation and control process, which may be implemented as MCU firmware, may include an application programming interface (API) for calling the calibration operation (e.g., called once per battery insertion). In addition, an API for servicing may be called a large number of times throughout the life of the battery (e.g., 100 times) to read the rolling counter 111 (through the snapshot register 115), and read input voltage, output voltage (if needed), and temperature from registers 207, 209, and 211, respectively. Based on those values, the computation process calculates the charge drawn for the current count of pulses during regular operation (as opposed to calibration), and based on the charge drawn operationally and the number of pulses, can compute the state of charge of the battery. The computation logic may utilize temperature in calculating estimates for how $I_{pk}$ may change as a function of temperature. The computation logic may also utilize an open circuit voltage (OCV) state of charge approach based on a battery voltage measurement. The computation process may look up an OCV-based state of charge from a table based on the open circuit voltage, temperature, and loading. The various state of charge estimates may be combined and used to produce a best guess at a single state of charge and battery lifetime remaining.

For some battery types, the open circuit voltage does not drop much with battery state of charge, but the battery internal resistance can rise significantly. For example, the internal resistance of LiMnO2 batteries rises approximately seven fold before the battery is completely depleted. That is also generally true of LTC batteries. In order to better handle batteries with such characteristics, as shown in FIG. 2C, three registers may be maintained to represent the battery voltage Vbat. One Vbat register 225 stores the maximum value of Vbat seen since the last time the register was cleared. A second Vbat register 227 maintains the minimum value of Vbat seen the since last time the second Vbat register was cleared. The maximum and minimum registers may be cleared periodically, so that a particular event, e.g., a cold snap, does not continue to affect current minimum or maximum values. A third Vbat register 229 stores an average battery voltage and may function as an infinite impulse response (IIR) first order filter, to yield the average battery voltage. Average battery voltage should be used for the $Q_{batOp}$ calculations. The maximum-minimum difference shows how battery voltage is changing versus time due to the pulsed nature of the load. For some battery chemistries, the maximum-minimum difference may be more useful for predicting battery state of charge than use of the open circuit voltage. The maximum battery value provides the best estimate to use for open circuit voltage based state of charge estimates. The minimum battery value is the ultimate warning of shutdown. When the minimum voltage drops below a predetermined limit, a flag may be set indicating the minimum voltage condition, and warning sent to the control logic.

Temperature has been described above as effecting, e.g., usable battery charge. Temperature can also have second order effects that may be accounted for in some embodiments. The resistance of the switch (to turn on/off inductor current), resistance of the inductor, and hookup resistance can become very important when Vin−Vout of the DC-DC converter is small. The charging of current in the inductor is really only approximately linear in time when the time is much smaller than the time constant of the charging circuit (L/$R_{total}$). When $I_{pk}*R_{total}$ is not much less than the |Vin−Vout|, the time to charge the inductor to $I_{pk}$ (and therefore the charge transferred during that time) is not independent of $R_{total}$. Corrections to account for nonzero R, and the resistance value can be stored in OTP (thus available to the calculation). In addition, the total resistance is generally quite temperature sensitive.

As mentioned above, the value of $I_{pk}$ is expected to change somewhat with temperature. The comparator that senses when the inductor current reaches the desired value may be offset cancelled, but has nonzero delay. The delay causes the inductor to be switched later than ideal, resulting in an increase in $I_{pk}$ which is proportional to the delay divided by the current slew rate ($V_{charge}$/L). The whole error depends on temperature (due to delay changing with temperature) and with voltage (affects both the delay and the $V_{charge}$). Corrections for dependence of $I_{pk}$ on temperature and voltage can be included in some embodiments.

Figure 4:
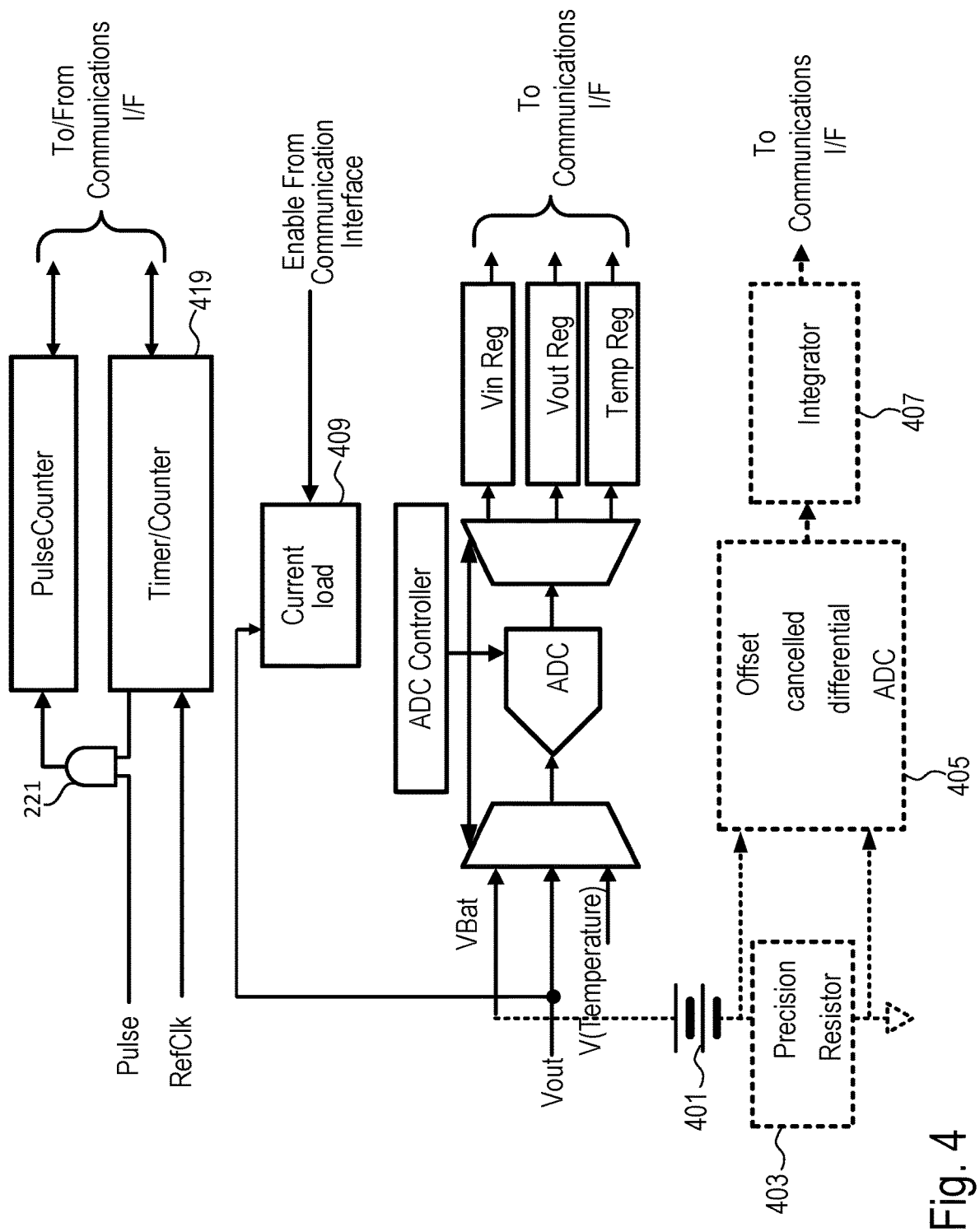
FIG. 4 illustrates another embodiment for calibrating charge drawn per pulse based on a measured voltage drop (IR drop) across a small resistor in series with the power supply while a current load has been added to the system.
Figure 5:
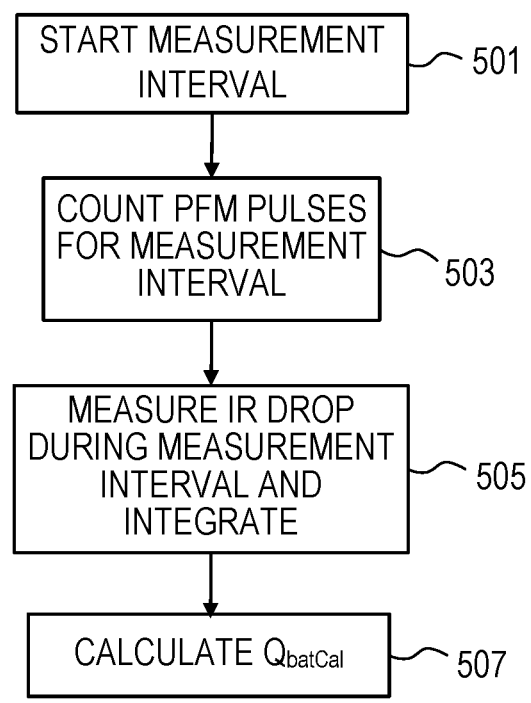
FIG. 5 shows a flow chart illustrating operation of the embodiment measuring IR drop in conjunction with added calibration current load.

In another embodiment, rather than use the calibration approach described in FIGS. 2 and 3, another calibration approach uses a modified IR drop calibration approach as illustrated in FIGS. 4 and 5. Referring to FIG. 4, the portion of the figure above the battery 401 is similar to the calibration hardware shown in FIG. 2 for the known current load-based calibration. The portion in dotted lines including precision sense resistor 403, ADC 405, and integrator 407 illustrate the analog front end (AFE) of an IR drop measuring system. During calibration, the integrator 407 integrates the voltage across the precision resistor 403. In the embodiment illustrated in FIG. 4, the IR drop measuring system is used only in calibration, and only when the current load 409 is enabled. In an embodiment, the current load 409 may be implemented as an approximately 10 mA current source that is enabled during calibration or a switched resistor to cause an additional approximately 10 mA loading when the resistance load is coupled through a switch (not shown) to the output of the voltage converter so as to cause the higher current load (lower output resistance). If the current load is sufficiently high, the IR drop measured across the sense resistor 403 is much larger than the residual offset of the ADC 405. Therefore, the residual offset has negligible effect on the accuracy. In an embodiment, the ADC may be chopped to help achieve an effective offset <=10 uV.

The ADC 405 may be conveniently implemented as a ΣΔ analog to digital converter, which has a high sampling rate, allowing for minimal anti-alias filtering, and is consistent with a fast calibration operation. The integrator 407 should be started/stopped in sync with the timer/counter 419, so that the integrated IR drop signal (which may include a changing load current in contrast to the calibration approach of FIG. 2) corresponds exactly to the counted pulses. With the current source or switched resistor enabled, total current draw is enough to produce an IR drop that is >1 mV, and is >> residual offset of the IR based measurement system. Thus, e.g., $V_{IR}$ is at least one or two orders of magnitude greater than the residual offset voltage. IR based measurement is a true representation of average current draw during the measurement interval, with offset causing error <1%.

FIG. 5 illustrates steps of an embodiment of the IR drop calibration approach. As noted above, the control logic (e.g., the MCU) does not need to shut down system loads which might draw substantial time-varying current. The load current should be $$V_{IR} = R_{sense}I_{bat} = R_{sense}(I_{calLoad} + I_{otherLoads})\frac{V_{out}}{\mathit{eff} \cdot V_{bat}} \gg V_{residOffset},$$

where $V_{IR}$ is the voltage across the sense resistor, $R_{sense}$ is the resistance of the sense resistor, $I_{bat}$ is the current from the battery, $I_{calLoad}$ is current through the calibration current load, $I_{otherLoads}$ is current through other loads of the system, eff is efficiency, and $V_{residOffset}$ is the residual offset voltage. In 501 the measurement interval ($T_{meas}$) is started by the calibration logic. In 503 the calibration logic counts number of PFM pulses ($N_{PFM}$) in the measurement interval ($T_{meas}$), and in 505 the calibration logic measures the IR drop and integrates the IR drop during the measurement interval. The measurement interval $T_{meas}$ may be, e.g., 2 ms, during which approximately 400 PFM pulses are generated, and in an embodiment results in an error of less than 0.25%. Finally, in 507 the charge drawn per pulse from the battery, $Q_{batCal}$, is determined. The charge drawn per pulse from the battery may be calculated as $$Q_{batCal} = \frac{V_{IR}T_{meas}}{N_{PFM}R_{sense}},$$

where $V_{IR}/R_{sense}$ is the current, and assuming $V_{IR}$ represents the average, then $(V_{IR} \times T_{meas}/R_{sense})$ is the total charge drawn during the measurement interval, and dividing by $N_{PFM}$ provides charge per pulse.

If more than one PFM mode DC-DC converter is present in the system (for example, there may be multiple supply voltages with one DC-DC converter per supply voltage), the operation above may be repeated for each DC-DC converter with a current load enabled for each DC-DC converter output in turn. With M DC-DC converters present, the calibration logic solves M equations to obtain a value of $Q_{bat}$ for each DC-DC converter.

Because the modified IR drop calibration approach does not require shutting down other system loads during the IR drop calibration, it is possible to calibrate often enough so that changes in temperature and Vbat, which would change $Q_{bat}$, may be tracked directly without monitoring changes in Vout and Vbat. Further, because the embodiment of FIG. 4 allows for calibration when the containing system is not halted, calibration can occur even when the system is not under the control of local control logic, which prevents system loads from being disabled. It is also not necessary to estimate changes in peak current with temperature, monitor temperature, and recalculate $Q_{bat}$ as a function of temperature when temperature changes. In addition, because the IR drop measurement is made in series with the battery, no estimated efficiency (which may not be precisely known) shows up in the equations for $Q_{batCal}$ determined using the second calibration approach.

Thus, this second calibration approach can be used to generate a calibration charge drawn per PFM pulse from the battery and the compensation and control logic 119 (see FIG. 1) can be used to generate the charge used operationally based on the calibration value of $Q_{batCal}$ and using equations such as equation (5) and knowing Vbat and Vout values during operation. Alternatively, the IR calibration approach can be run often enough to account for a change in Vbat, or in response to a change in Vbat above a respective threshold or when the system is made aware of a change in Vout.

Figure 6:
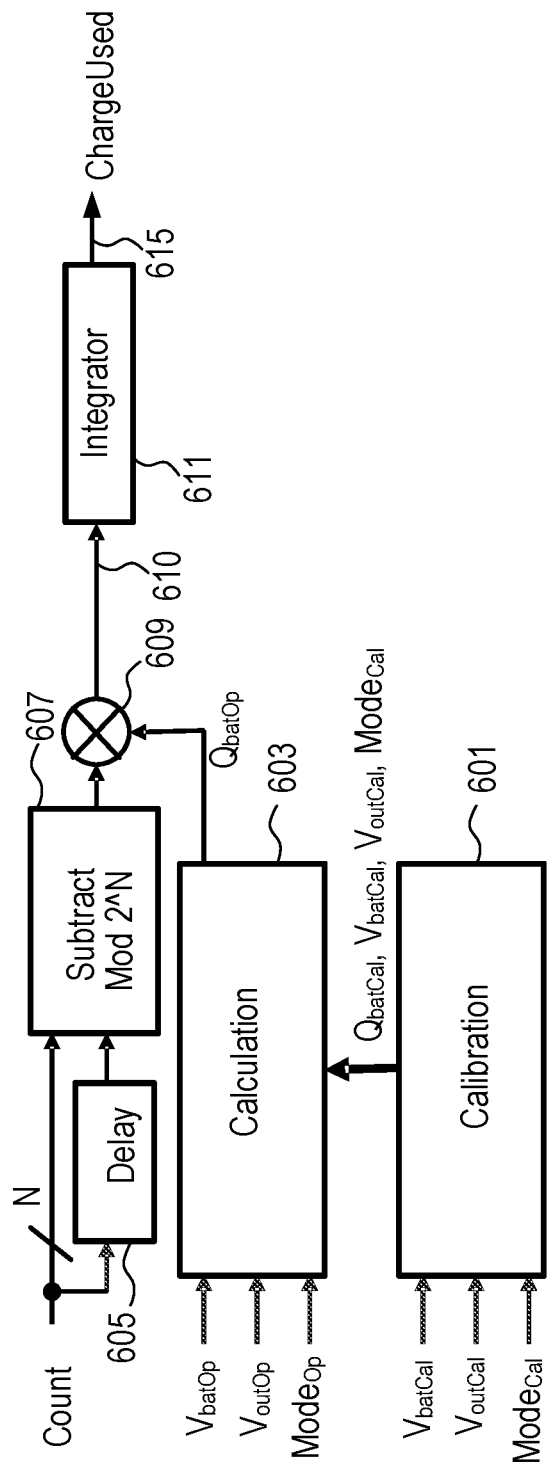
FIG. 6 illustrates a different perspective of a top level view of a charge measuring system according to an embodiment.

FIG. 6 illustrates another perspective of an embodiment of a system to generate battery state of charge and the total charge drawn from the battery. The calibration operation 601 may be implemented in accordance with the embodiments of FIG. 2A or FIG. 4. The calculation 603 determines the charge per pulse drawn from the battery ($Q_{batOp}$) observed during operation and records the value, along with the relevant voltages (e.g., $V_{bat}$ and $V_{out}$) and the mode (e.g., buck, boost, or buck-boost) during the calculation operation. The calculation 603 produces $Q_{batOp}$ as a function of the current conditions, e.g., $V_{bat}$ and $V_{out}$, the $Q_{batCal}$ measured during the calibration operation, and the conditions, e.g., $V_{batcal}$ and $V_{outcal}$ during the calibration operation.

All operations in the diagram are done sufficiently rarely so as to draw negligible average power and sufficiently often that count supplied by pulse counter 111 (see FIG. 1) does not overflow more than once. In an embodiment counter overflow may occur every 35 minutes at full load current. The combination of delay 605 and the subtraction process 607 produces the change in count since the last calculation. The change in count is supplied to the multiplier 609, which multiplies the pulse count multiplied by the charge drawn from the battery per pulse to generate charge drawn for the current count 610 and supplies that value to the integrator 611, which integrates the charge drawn for the current count 610 to supply the total charge supplied by the battery 615.

Thus, various aspects have been described relating to determining battery charge drawn and battery charge remaining. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
setting a calibration current load of a pulse frequency modulated (PFM) DC-DC converter to a first current load;
determining a first PFM frequency of the PFM DC-DC converter with the first current load coupled to the PFM DC-DC converter;
setting the calibration current load for the PFM DC-DC converter to a second current load higher than the first current load;
determining a second PFM frequency of the PFM DC-DC converter with the second current load coupled to the PFM DC-DC converter; and
determining a charge drawn per pulse from a battery based in part on the first PFM frequency and the second PFM frequency.

2. The method as recited in claim 1 further comprising determining the charge drawn per pulse from the battery further using an efficiency of the PFM DC-DC converter.

3. The method as recited in claim 1 further comprising determining the charge drawn per pulse from the battery further using a first difference between the first current load and the second current load and further using a second difference between the first PFM frequency and the second PFM frequency.

4. The method as recited in claim 1 setting the calibration current load using a variable resistance.

5. The method as recited in claim 1 further comprising:
updating the charge drawn per pulse from the battery based on at least one of a change in battery voltage, a change in output voltage, and a change in temperature; and
supplying an updated charge drawn per pulse from the battery.

6. The method as recited in claim 1 further comprising:
converting battery voltage, temperature, and output voltage of the PFM DC-DC converter, to respective digital values; and
supplying the respective digital values for use in determining the charge drawn per pulse from the battery.

7. The method as recited in claim 1 further comprising:
determining the first PFM frequency according to a first measurement interval and a first pulse count during the first measurement interval; and
determining the second PFM frequency according to a second measurement interval and a second pulse count during the second measurement interval.

8. The method as recited in claim 1 further comprising:
determining the first PFM frequency by measuring a first length of time for a fixed number of pulses to occur with the first current load; and
determining the second PFM frequency by measuring a second length of time for the fixed number of pulses to occur with the second current load.

9. An apparatus comprising:
a calibration current load coupled to an output of a pulse frequency modulated (PFM) DC-DC converter during a calibration operation;
wherein the calibration current load is configurable as a first current load during a first portion of the calibration operation and as a second current load higher than the first current load during a second portion of the calibration operation to thereby increase charge supplied from a battery with the second current load as compared to the first current load; and
wherein the calibration operation determines a charge drawn per pulse from the battery.

10. The apparatus of claim 9 wherein the calibration current load comprises a variable resistance.

11. The apparatus of claim 9 wherein with the first current load coupled to the PFM DC-DC converter, a first PFM frequency is determined, and with the second current load coupled to the PFM DC-DC converter, a second PFM frequency is determined.

12. The apparatus as recited in claim 11 further comprising:
computation logic configured to determine the charge drawn per pulse from the battery using the first PFM frequency, the second PFM frequency, the first current load, and the second current load.

13. The apparatus as recited in claim 12 wherein the computation logic is further configured to further use an efficiency of the PFM DC-DC converter to determine the charge drawn per pulse from the battery.

14. The apparatus as recited in claim 12 wherein the computation logic is further configured to update the charge drawn per pulse from the battery based on at least one of a change in battery voltage, a change in output voltage, and a change in temperature, and supply an updated charge drawn per pulse from the battery.

15. The apparatus as recited in claim 14 further comprising:
an analog to digital converter to convert at least one of battery voltage, temperature, and output voltage of the PFM DC-DC converter, to respective digital values and supply the respective digital values for use in determining the charge drawn per pulse from the battery.

16. The apparatus of claim 11 further comprising:
an interval counter to determine a measurement interval during the calibration operation; and
a pulse counter to count pulses corresponding to switching events that occur in the PFM DC-DC converter during the measurement interval.

17. The apparatus of claim 16 wherein with the first current load coupled to the PFM DC-DC converter, the interval counter measures a first measurement interval and the pulse counter provides a first pulse count, the first PFM frequency being determined using the first measurement interval and the first pulse count and with the second current load coupled to the PFM DC-DC converter, the interval counter measures a second measurement interval and the pulse counter provides a second pulse count, the second PFM frequency being determined by the second measurement interval and the second pulse count.

18. The apparatus as recited in claim 9 wherein,
the calibration current load is coupled to the output of the PFM DC-DC converter during the calibration operation to increase charge supplied from the battery as compared to an operational charge supplied from the battery with the calibration current load not coupled to the output of the PFM DC-DC converter.

19. A method comprising:
supplying charge from a battery to a pulse frequency modulated (PFM) DC-DC converter;
setting a calibration current load of the PFM DC-DC converter to a first current load;
determining a first PFM frequency of the PFM DC-DC converter with the first current load coupled to the PFM DC-DC converter;
setting the calibration current load for the PFM DC-DC converter to a second current load higher than the first current load;
determining a second PFM frequency of the PFM DC-DC converter with the second current load coupled to the PFM DC-DC converter; and
determining a charge transferred to an output of the PFM DC-DC converter per pulse during calibration according to a ratio of a first difference between the first current load and the second current load and a second difference between the first PFM frequency and the second PFM frequency.

20. The method as recited in claim 19 further comprising determining the charge drawn per pulse from the battery during calibration using the charge transferred to the output of the PFM DC-DC converter.

* * * * *